United States Patent

Mizushima et al.

[15] 3,638,082

[45] Jan. 25, 1972

[54] PNPN IMPATT DIODE HAVING UNEQUAL ELECTRIC FIELD MAXIMA

[72] Inventors: Yoshihiko Mizushima; Kuniyasu Kawarada, both of Tokyo, Japan

[73] Assignee: Nippon Telegraph and Telephone Public Corporation, Tokyo, Japan

[22] Filed: Sept. 19, 1969

[21] Appl. No.: 859,260

[30] Foreign Application Priority Data

Sept. 21, 1968 Japan....................................43/68123

[52] U.S. Cl.......................317/235 R, 317/235 K, 317/235 T, 317/235 AA, 317/235 AB, 317/235 AD

[51] Int. Cl..........................H01l 9/10, H01l 9/12, H01l 11/10

[58] Field of Search .......317/235 K, 235 T, 235 AA, 235 AB

[56] References Cited

UNITED STATES PATENTS

| | | | |
|---|---|---|---|
| 2,895,109 | 7/1959 | Weinreich | 332/52 |
| 2,899,646 | 8/1959 | Read | 331/96 |
| 2,967,793 | 1/1961 | Philips | 148/33 |
| 3,158,754 | 11/1964 | Yu | 317/235 AD UX |
| 3,229,104 | 1/1966 | Rutz | 250/211 |
| 3,284,639 | 11/1966 | Giuliano et al. | 317/235 AD UX |
| 3,356,866 | 12/1967 | Misawa | 317/235 AD UX |
| 3,426,295 | 2/1969 | De Loach et al. | 331/107 |
| 3,566,206 | 2/1971 | Bartelink et al. | 317/234 |

*Primary Examiner*—John W. Huckert
*Assistant Examiner*—William D. Larkin
*Attorney*—Watson, Cole, Grindle & Watson

[57] ABSTRACT

This invention relates to a high-frequency semiconductor device wherein the internal built-in electric field distribution in a semiconductor is made to have two peak values under a DC bias condition and an avalanche multiplication effect in the semiconductor is used to obtain a high-efficiency oscillation in a high-frequency region.

8 Claims, 6 Drawing Figures

INVENTOR

Yoshihiko Mizushima
Kuniyasu Kawarada

BY

Watson, Cole, Grindle & Watson
ATTORNEY

PNPN IMPATT DIODE HAVING UNEQUAL ELECTRIC FIELD MAXIMA

SUMMARY OF THE INVENTION

This invention relates to a high-frequency semiconductor device wherein semiconductor elements are used to obtain a high-frequency oscillation output. BACKGROUND OF THE INVENTION There are known high-frequency semiconductor devices wherein semiconductor elements having a PN-junction are utilized to obtain a high-frequency oscillation output. It utilizes an avalanche carrier multiplication phenomenon caused within semiconductor elements by impressing a backward bias on a PN-junction. In case of semiconductor elements having such conventional single PN structure, however, in order that the space charge effect on the internal built-in field of the semiconductor elements may be effective as an important factor in high-efficiency operation, a high current density is required. Therefore, such devices have the disadvantage that their oscillation efficiency is low because of the absence of a high current density.

Therefore, an object of the present invention is to provide an improved high-frequency semiconductor device wherein a high-frequency output is obtained with high efficiency by using a combination of single PN-junctions.

The high-frequency semiconductor device according to the present invention is characterized by a semiconductor device comprising a PNPN-structure extending between first and second electrodes wherein an optimum internal electric field distribution is created at regions in the semiconductor device so that initially one PN-junction has an electric field which induces avalanche breakdown and the other PN-junction has an electric field which is just below the avalanche point. Carriers from the first junction migrate to the second junction and cause the electric field distribution across that junction to increase above the threshold of the avalanche breakdown. Carriers from the second junction migrate to the first junction and increase the weakened electric field distribution (caused by the former carrier migration) to reestablish avalanche breakdown at the first junction and initiate the cyclic migration of carriers described above. A high-frequency oscillation results from the avalanche carrier multiplication and carrier transit time effects. In the present invention, the above described internal electric field distribution having optimum values at the two regions in the semiconductor device is called a dual-peak field distribution.

DETAILED DESCRIPTION

Figure 1:
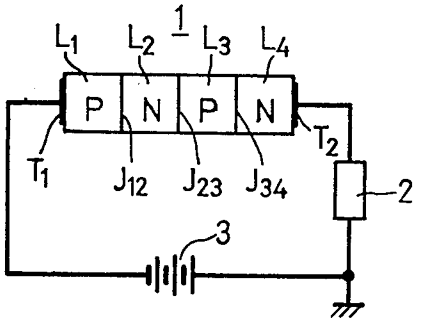
FIG. 1 is a diagram showing an embodiment of the high-frequency semiconductor device according to the present invention.

FIG. 1, represents a semiconductor device wherein a P-layer $L_1$, N-layer $L_2$, P-layer $L_3$ and N-layer $L_4$ are arranged in the order mentioned to form junctions $J_{12}$, $J_{23}$ and $J_{34}$, the first and second electrodes $T_1$ and $T_2$ are attached to the P-layer $L_1$ and N-layer $L_4$ respectively, and a DC bias source 3 is connected between the electrodes $T_1$ and $T_2$, through a load 2, for example a resistance, with the electrodes $T_1$ and $T_2$ respectively biased negatively and positively. The load one may be a resistance, transmission line, or a resonant circuit. For microwave use the resonant circuit can comprise coaxial cavity or a waveguide cavity, and in such cases the semiconductor element may be mounted in the cavity.

Figure 2:
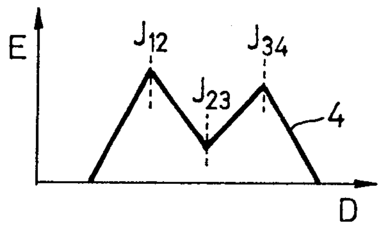
FIG. 2 is a field distribution diagram for explaining the operation of FIG. 1.

Thus, the semiconductor device 1 has a structure which may be represented as two cascade-connected PN structures. Therefore, if a backward bias is provided from bias source 3 to the junctions $J_{12}$ and $J_{34}$ of the two equivalent elements and, if the distance D in the direction of the layers $L_1$, $L_2$, $L_3$ and $L_4$ of the semiconductor device 1 is represented as the abscissa and the electric field strength E within the semiconductor device 1 is represented as the ordinate, as shown in FIG. 2, there will be obtained a dual-peak field distribution curve 4 presenting optimum values substantially in the positions of the junctions $J_{12}$ and $J_{34}$. In such case, the positions in which the optimum values of the dual-peak field distribution curve 4 are obtained can be varied by varying the respective thickness of the layers $L_1$, $L_2$, $L_3$ and $L_4$. Further, the magnitude of the values of the curve 4 can be varied by varying the voltage value of the bias source 3.

In case the position and the value of the optimum peaks in the dual-peak field curve are properly selected, for example as in FIG. 2, wherein the initial field at junction $J_{12}$ exceeds the junction avalanche breakdown and the initial field at junction $J_{34}$ is less than the junction avalanche breakdown, an avalanche multiplication of the carriers will occur at $J_{12}$ first, the avalanche carriers will migrate toward junction $J_{34}$ and, after the carrier transit time, the optimum value of the electric field at $J_{34}$ will be pushed up into the avalanche region by the space-charge effect of the carriers avalanche multiplication at $J_{34}$ will be induced and carriers of an opposite polarity will migrate toward junction $J_{12}$. When such carriers come out of the depletion layer, the terminal voltage will rise again, an avalanche at $J_{12}$ will again occur and thereafter the operation will repeated. The amplitude of the conduction current induced in the external circuit will increase due to the carriers produced by the induced avalanche, the amplitude of the terminal voltage will also increase, and a high oscillation output will be obtained at the load 2. Even in a conventional unit PN structure, a dual-peak field distribution is temporarily formed and an induced avalanche can be produced. To realize such a state, however, a sufficiently high carrier density is required. Taking the influence of heat generation into consideration, it has been difficult to realize continuous operation. On the other hand, in the structure of the present invention, by forming a dual-peak field distribution with a DC bias condition, it is possible to cause an effective modification of the field distribution and an induced avalanche at a relatively low current density.

In fact, with the above-described semiconductor device 1, where the P-layer $L_3$ was formed by diffusion on semiconductor N-layer $L_4$ having a specific resistance of 1 Ω–cm.; to be the N-layer $L_4$, the N-layer $L_2$ was diffused on P-layer $L_3$; P-layer $L_1$ was diffused on N-layer; the layers $L_3$, $L_2$ and $L_1$ were respectively made 2 $\mu$, 5 $\mu$ and 5 $\mu$ thick and were then mesa-etched; the cross-sectional area of the layer $L_1$ was a cross-sectional area corresponding to a diameter of approximately 200 $\mu$ ($3.14\times10^{-4}$cm.$^2$ an area corresponding to the junction $J_{12}$); the layers $L_1$ and $l_4$ to which the electrodes $T_1$ and $T_2$ were respectively attached were applied and the resulting semiconductor device 1 was connected to the load 2 and DC bias source 3 as described above and was mounted in a waveguide; a continuous oscillation output having an oscillation efficiency of 26 percent and a frequency of 9 gHz at an average current density of $3\times10^3$ a./cm.$^2$ was obtained.

What is to be noted here is that the semiconductor device 1 in this example has a PNPN-structure and therefore although the structure is apparently the same as a known conventional semiconductor-controlled rectifier (thyristor), in the latter, a variable bias with alternating polarity is provided to its PN-junction. In contradistinction thereto the semiconductor device 1 according to the present invention has a bias voltage of a fixed polarity so that a dual-peak field distribution is formed within the semiconductor device and oscillation effected by avalanche multiplication and the carrier transit time. If the semiconductor device according to the present invention is combined with microwave circuit elements to operate in a region of such high frequency at which the transit time effect cannot be ignored, the optimum value of the effectively operating cross-sectional area in the junctions $J_{12}$, $J_{23}$ and $J_{34}$ in the semiconductor device 1 is made smaller than an area corresponding to a diameter of $3.14\times10^{-4}$cm.$^2$ and the total length of the active zone is made less than 40 $\mu$. Such limitations of the cross-sectional area and total length are based on the fact that, in the case of the former, due to the increase of the capacitance between the electrodes $T_1$ and $T_2$, the above-described oscillation output will otherwise be no longer obtained and that in the case of the latter, the oscillation frequency will otherwise be reduced to a practically insignificant frequency region. Therefore, the semiconductor device such as the known conventional thyristor and the present invention are also distinguished from each other in the device dimensions such as the cross-sectional area and total length. Therefore, the semiconductor device in this embodiment is characterized in that it has a dual-peak field distribution and also a high-frequency casing to be mounted in a waveguide or strip line; and the maximum cross-sectional area of the junctions $J_{12}$, $J_{23}$ and $J_{34}$ within the semiconductor device is smaller than an area approximately $3.14\times10^{-4}$cm.$^2$ and their total length is selected to be less than 40 $\mu$.

Figure 3:
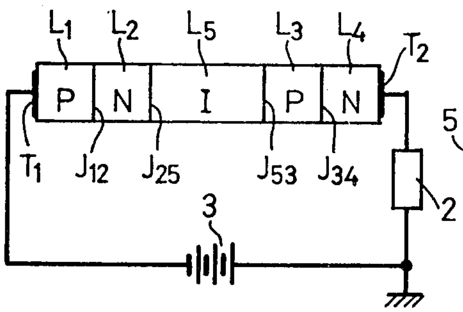
FIGS. 3 to 6 are diagrams showing other embodiments of the high-frequency semiconductor device according to the present invention.

Now, the embodiment in FIG. 3 shall be described. In this embodiment, the semiconductor device 1 is the same as is described above with reference to FIG. 1 except that an I-layer $L_5$ is inserted between the N-layer $L_2$ and P-layer $L_3$ in the embodiment in FIG. 1 and therefore a junction $J_{25}$ between the N-layer $L_2$ and I-layer $L_5$ and a junction $J_{35}$ between the I-layer $L_5$ and P-layer $L_3$ are formed instead of the junction $J_{23}$ in FIG. 1. The same corresponding signs are attached to the respective parts corresponding to those in FIG. 1 and detailed explanations of such parts are omitted. This embodiment, too, has a PN structure composed of the P-layer $L_1$ and N-layer $L_2$ and a PN structure composed of the P-layer $L_3$ and N-layer $L_4$ are cascade connected through the I-layer $L_5$. Therefore, by properly selecting the thickness of the layers $L_1$ to $L_4$ including the I-layer $L_5$, the same operation and effect as described above with reference to FIG. 1 are obtained. In fact, the semiconductor device in this embodiment, where the layers $L_1$, $L_2$, $L_5$, $L_3$ and $L_4$ were formed by diffusion in the same manner as in the case of FIG. 1, were the mesa etched and were then made respectively 5 $\mu$, 5 $\mu$, 20 $\mu$, 3 $\mu$ and 2 $\mu$ thick, the cross-sectional area of the layer $L_4$ corresponded to an area of approximately $1.75\times 10^{-4}$cm.$^2$ or a diameter of 150 $\mu$ and then the device was mounted in a waveguide, an oscillation output of about 2.5 gHz was obtained.

Figure 4:
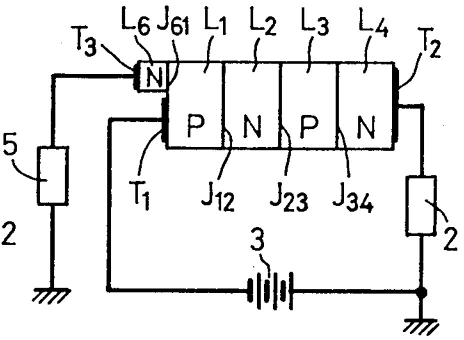

Now the embodiment in FIG. 4 shall be described. In the embodiment the semiconductor device 1 is the same as is described above with reference to FIG. 1 except that an N-layer $L_6$ is arranged on a part of the P-layer $L_1$, a junction $J_{61}$ is formed between the N-layer $L_6$ and P-layer $L_1$, a third electrode $T_3$ is attached to the N-layer $L_6$ and a DC or AC control bias source 5 is connected to the electrode $T_3$. The same corresponding signs are attached to the respective parts corresponding to those in FIG. 1 and detailed explanations of such parts are omitted. However, in this embodiment, the same oscillation output as is described above with reference to FIG. 1 is minority carriers are injected into the layer $L_1$ across the junction $J_{61}$ from the bias source 5 to control the oscillating output. For example, if a DC bias is applied by the bias source 5 and if a pulse signal is applied, an oscillation output synchronized with the pulse signal is obtained. If a gate signal is applied the oscillation is started or stopped by the gate signal.

Figure 5:
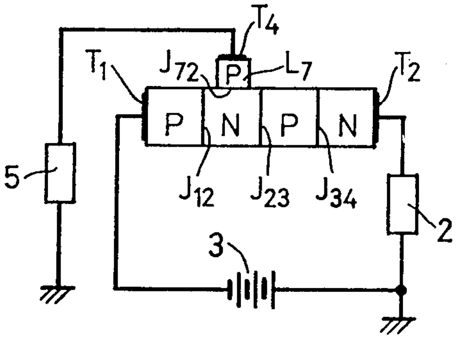

Further, the embodiment in FIG. 5 shall be described. In this embodiment, the semiconductor device 1 is the same as is described above with reference to FIG. 1 except that a P-layer $L_7$ is arranged on the N-layer $L_2$, a junction $J_{72}$ is formed between the P-layer $L_7$ and N-layer $L_2$, a third electrode $T_4$ is attached to the P-layer $L_7$ and a control bias source 5 is connected to the electrode $T_4$ in the same manner as is described above with reference to FIG. 4. Therefore, the same corresponding signs are attached to the respective parts corresponding to those in FIG. 1 and detailed explanations of such parts shall be omitted. However, as minority carriers are injected into the layer $L_2$ across the junction $J_{72}$ from the bias source 5, the same operation and effect as are described above with reference to FIG. 4 is obtained.

Figure 6:
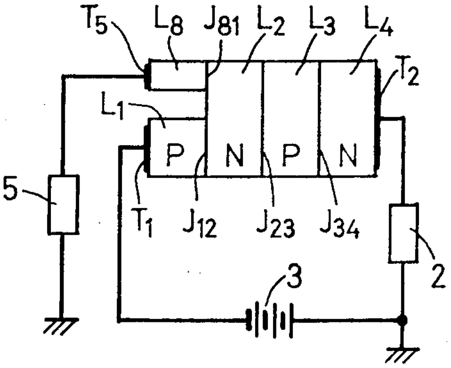

Still further, the embodiment in FIG. 6 shall be described. In this embodiment, the semiconductor device 1 is the same as is described above with reference to FIG. 1 except that the P-layer $L_1$ is partly removed and replaced by a P-layer $L_8$, a junction $J_{82}$ is formed between the P-layer $L_8$ and N-layer $L_2$, a third electrode $T_5$ is attached to the P-layer $L_8$ and a control bias source 5 is connected to the electrode $T_5$ in the same manner as is described above with reference to FIG. 4. Therefore, the same corresponding signs are attached to the respective parts corresponding to those in FIG. 1 and detailed explanations of such parts are omitted. However, as minority carriers are injected into the layer $L_2$ across the junction $J_{82}$ from the bias source 5, the same operation and effect as are described above with reference to FIG. 4 is obtained.

In the above description, only a few embodiments of the present invention are shown. It will be obvious, for example, the injection of minority carriers as is shown in FIGS. 4 to 6 can be applied also to the semiconductor device described above with reference to FIG. 3.

However, the main point of this invention is that a semiconductor device is so made as to be able to produce a sufficiently high electric field distribution at two regions in the semiconductor device by applying a required DC bias between the first and the second electrodes to cause an alternating avalanche breakdown at said regions and, in such a state, a high-frequency oscillation output may be obtained on the basis of a carrier multiplication phenomenon by an avalanche and a carrier transit-time effect.

In the above-description, an oscillation output is obtained where the DC bias source 3 is connected only between the electrodes $T_1$ and $T_2$. However, it is also possible to adjust the DC bias just below the threshold necessary to produce an oscillation output and to add another control bias voltage superposed on the first bias through the third electrode to obtain an oscillatory output. In such case, the control bias source may be connected in series with the DC bias source 3. Also the control bias source in this case may consist of pulses.

Further, in the above descriptions, the case has mainly been considered that the oscillation output of a continuous periodic wave is controlled. However, for example, if in the above described DC bias state, a resistive load is connected as the external load 2 and a pulse voltage having a pulse width of about one-half of the oscillation period is applied as an input signal voltage, an amplified output pulse, corresponding one to one to the input pulse, can be delivered to the load and so, the device can operate as a high-speed pulse amplifier. In such a case, no particular consideration is required with respect to the transit-time effect.

What is claimed is:

1. A high-frequency semiconductor comprising:

a semiconductor element having at least four layers of alternating conductivity type and at least three rectifying junctions, the two endmost junctions having unequal reverse breakdown voltages, means for providing a DC voltage bias across said semiconductor element, said bias providing a backward bias to both endmost junction and having a magnitude so that a dual-peak electric field distribution is established across said semiconductor element, one said peak is at one endmost rectifying junction and the other said peak is at the other endmost rectifying junction, one of said peaks exceeds the avalanche breakdown of the associated junction and the other said peak is lower than the avalanche breakdown of the other associated junction, load means connected to said semiconductor element for receiving the oscillatory output signal from said semiconductor element.

2. A high-frequency semiconductor device as in claim 1 wherein the effective cross-sectional area of said semiconductor element is less than approximately $3.14\times10^{-4}$cm.$^2$ and the distance between the endmost junctions is less than 40 microns.

3. A high-frequency semiconductor device as in claim 1, wherein said rectifying junctions are formed in a cascade arrangement to form a PNPN-structure and the electric field at the middle junction is substantially less than the electric field at said endmost junctions.

4. A high-frequency semiconductor device as in claim 1 wherein said semiconductor element further includes an I-layer to form a PNIPN structure, and the effective cross-sectional area of said semiconductor element is substantially equal to $1.75\times10^{-4}$cm.$^2$.

5. A high-frequency semiconductor device as in claim 3, wherein said semiconductor element further includes an additional N-layer forming a junction with the end P-layer and said semiconductor device further comprises means for providing a control bias to said additional junction for controlling the oscillatory output of said device.

6. A high-frequency semiconductor device as in claim 3 wherein said semiconductor element further includes an additional P-layer forming a junction with the end N-layer and said device further comprises means for providing a control bias to said additional junction for controlling the oscillatory output of said device.

7. A high-frequency semiconductor device as in claim 3 wherein the end P-layer is partially removed from the adjacent N-layer thereby forming two separate rectifying junctions, one of said separate rectifying junctions is one of said at least three rectifying junctions, and said device further comprises means for providing a control bias to the other of said two separate rectifying junctions for controlling the oscillatory output of said device.

8. A high-frequency semiconductor device as in claim 4 wherein the layers of said semiconductor element have respective widths of 5 $\mu$, 5 $\mu$, 20 $\mu$, 3 $\mu$ and 2 $\mu$.

* * * * *